US012784807B2

(12) United States Patent
Chi et al.

(10) Patent No.: US 12,784,807 B2
(45) Date of Patent: Nov. 3, 2026

(54) MEMORY SIGNAL CALIBRATION APPARATUS AND METHOD

(71) Applicant: REALTEK SEMICONDUCTOR CORPORATION, Hsinchu (TW)

(72) Inventors: Kuo-Wei Chi, Hsinchu (TW); Chun-Chi Yu, Hsinchu (TW); Shih-Chang Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 181 days.

(21) Appl. No.: 18/793,029

(22) Filed: Aug. 2, 2024

(65) Prior Publication Data

US 2025/0054534 A1 Feb. 13, 2025

(30) Foreign Application Priority Data

Aug. 8, 2023 (TW) ................................ 112129806

(51) Int. Cl.
*G11C 11/4076* (2006.01)
*G11C 7/22* (2006.01)
*G11C 11/4093* (2006.01)

(52) U.S. Cl.
CPC .......... *G11C 11/4076* (2013.01); *G11C 7/222* (2013.01); *G11C 11/4093* (2013.01); *G11C 2207/2254* (2013.01)

(58) Field of Classification Search
CPC ... G11C 11/4076; G11C 7/1078; G11C 7/222; G11C 11/4093; G11C 2207/2254; G11C 7/04
See application file for complete search history.

(56) References Cited

U.S. PATENT DOCUMENTS 8,787,097 B1 * 7/2014 Chong ................ G11C 7/1066 365/194
8,929,162 B1 * 1/2015 Fender ................ G11C 7/1051 365/193
9,105,327 B2 * 8/2015 Prakash ................ G11C 7/222
10,325,636 B1 * 6/2019 Purohit ................ G11C 7/222
10,978,118 B1 * 4/2021 Yu ....................... G11C 7/1066
11,978,497 B2 5/2024 Chi (Continued)

*Primary Examiner* — Mushfique Siddique

(74) *Attorney, Agent, or Firm* — WPAT, PC

(57) ABSTRACT

The present disclosure discloses a memory signal calibration apparatus and a memory signal calibration method. A gating circuit generates a data strobe enablement setting signal according to a setting control signal, generates an enabling state of the data strobe enablement signal and performs gating on a data strobe signal according to the enabling state to generate a gated data strobe signal. A calibration circuit is configured to generate a pulse indicating signal having an indicating state corresponding to a clock pulse section of the data strobe signal, delay the data strobe enablement setting signal to generate a first delay signal, delay the first delay signal to generate a second delay signal, sample the pulse indicating signal according to the first and the second delay signals to generate a sampling result, and controls an enablement signal setting circuit adjusts the setting control signal according to a sampling result so as to control the gating circuit adjusts the timings of the data strobe enablement setting signal and the data strobe enablement signal.

16 Claims, 6 Drawing Sheets

(56) References Cited

U.S. PATENT DOCUMENTS

2007/0217559 A1* 9/2007 Stott ..................... H04L 7/0008
375/355
2013/0297961 A1* 11/2013 Zhu ........................... G06F 1/04
713/401
2016/0260465 A1* 9/2016 Fung ...................... G11C 7/222

* cited by examiner

MEMORY SIGNAL CALIBRATION APPARATUS AND METHOD

BACKGROUND OF THE INVENTION

1. Field of the Invention

The present disclosure relates to a memory signal calibration apparatus and a memory signal calibration method.

2. Description of Related Art

Generally, when reading data of a Double Data Rate Synchronous Dynamic Random Access Memory (DDR SDRAM), the DDR SDRAM sends a data strobe (DQS) signal and a data (DQ) signal to a memory access interface apparatus. The DQS signal includes a tristate section, a preamble section, and a clock pulse section that includes a plurality of clock pulses in sequence. The tristate section is the signal between a previous access operation and a current read operation. The preamble section is used for reminding the controller of preparing to read the DQ signal according to the clock pulses of the clock pulse section. The clock pulse section follows the preamble.

In order to have a sampling circuit properly sample the DQ signal according to the clocks of the DQS signal instead of the tristate of the DQS signal, the memory access interface apparatus uses a duration of a data strobe enablement (DQS_EN) signal being at a specific level (e.g., high level) to include the start and end of the clock pulse section of the DQS signal. Preferably, the controller has the level of the DQS_EN signal changing from an original level to the specific level at the middle position of the preamble section of the DQS signal, and has the level of the DQS_EN signal returning to the original level according to a read/write command received by the DDR SDRAM. Accordingly, the duration of the DQS_EN signal being at the specific level can properly include the clock pulse section of the DQS signal without including the tristate section, and allows the sampling circuit to sample the DQ signal according to the correct part of the DQS signal (i.e., the clock pulse section of the DQS signal).

However, even though the position of the preamble section of the DQS signal is found and used for correctly setting the timing of the level change of the DQS_EN signal, the position of the preamble section may vary with the voltage and/or temperature. This is especially serious when reading data of a Low Power Double Data Rate Synchronous Dynamic Random Access Memory (LPDDR SDRAM) because the position variation of the preamble of the LPDDR SDRAM's DQS signal may exceed the length of this preamble section. Therefore, after the voltage and/or temperature change(s), the duration of the DQS_EN signal being at the specific level may not correctly include the clock pulse section of the DQS signal so that the sampling circuit may sample the DQ signal too early according to a wrong trigger signal (e.g., the tristate section) and obtain incorrect read data or the sampling circuit may sample the DQ signal too late and obtain incomplete read data.

In consideration of the aforementioned problems, Applicant provided a solution previously in US applications having the patent numbers of U.S. Pat. Nos. 10,978,118 and 11,114,2066. However, due to the configuration of the delay circuit implemented by logic gates and the data strobe signal having a higher frequency, the accuracy of the determination of the timing of the data strobe signal is still not enough.

SUMMARY OF THE INVENTION

In consideration of the problem of the prior art, an object of the present disclosure is to provide a memory signal calibration apparatus and a memory signal calibration method.

The present invention discloses a memory signal calibration apparatus that includes an enablement signal setting circuit, a gating circuit and a calibration circuit. The enablement signal setting circuit is configured to generate a setting control signal. The gating circuit is configured to generate a data strobe enablement setting signal having a single pulse according to the setting control signal, to begin to generate and maintain an enablement state of a data strobe enablement signal for a predetermined time period according to the single pulse, and to perform gating on a data strobe signal having a receiving timing according to the enablement state to generate a gated data strobe signal. The calibration circuit is configured to generate a pulse indicating signal having an indicating state corresponding to a clock pulse section of the data strobe signal, delay the data strobe enablement setting signal to generate a first delay signal, delay the first delay signal to generate a second delay signal, sample the pulse indicating signal according to the first delay signal and the second delay signal to generate a sampling result and control the enablement signal setting circuit to adjust the setting control signal according to the sampling result so as to control the gating circuit to adjust the timings of the data strobe enablement setting signal and the data strobe enablement signal.

The present invention also discloses a memory signal calibration method used in a memory signal calibration apparatus that includes steps outlined below. A setting control signal is generated by an enablement signal setting circuit. A data strobe enablement setting signal having a single pulse is generated according to the setting control signal by a gating circuit, to begin to generate and maintain an enablement state of a data strobe enablement signal for a predetermined time period according to the single pulse, and to perform gating on a data strobe signal having a receiving timing according to the enablement state to generate a gated data strobe signal. A pulse indicating signal having an indicating state corresponding to a clock pulse section of the data strobe signal is generated by a calibration circuit. The data strobe enablement setting signal is delayed to generate a first delay signal by the calibration circuit. The first delay signal is delayed to generate a second delay signal by the calibration circuit. The pulse indicating signal is sampled according to the first delay signal and the second delay signal to generate a sampling result by the calibration circuit. The enablement signal setting circuit is controlled to adjust the setting control signal according to the sampling result by the calibration circuit so as to control the gating circuit to adjust the timings of the data strobe enablement setting signal and the data strobe enablement signal.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a memory signal calibration apparatus and a memory signal calibration method to delay a data strobe enablement setting signal without using logic gates to generate a delayed signal used for sampling to avoid the influence of the temperature, voltage and manufacturing process. Further, by selecting the pulse indicating signal corresponding to the clock pulse section as the object being sampled instead of the data strobe signal itself can provide much room for sampling to generate the sampling result since the frequency of the pulse indicating signal is much lower than the frequency of the data strobe signal. Not only the accuracy of the determination of the timing of the data strobe signal can be increased, but also the accuracy of the adjustment of the timing of the data strobe enablement signal can be increased.

Figure 1:
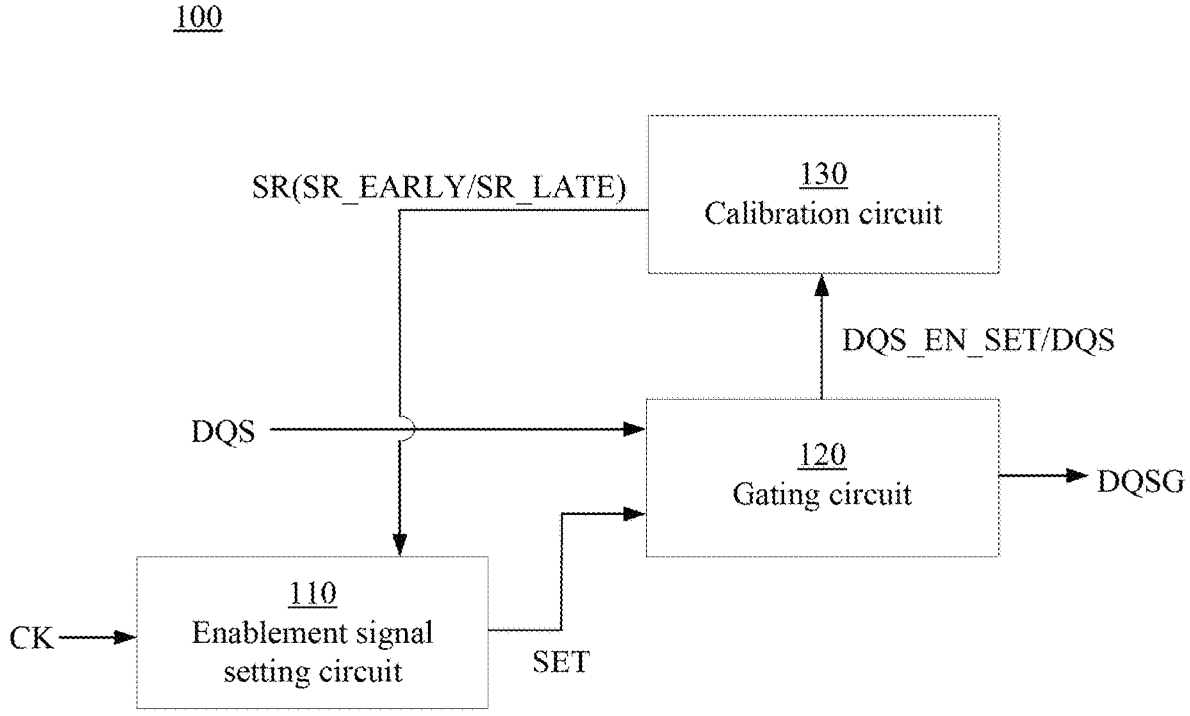
FIG. 1 illustrates a block diagram of a memory signal calibration apparatus according to an embodiment of the present invention.
Figure 2:
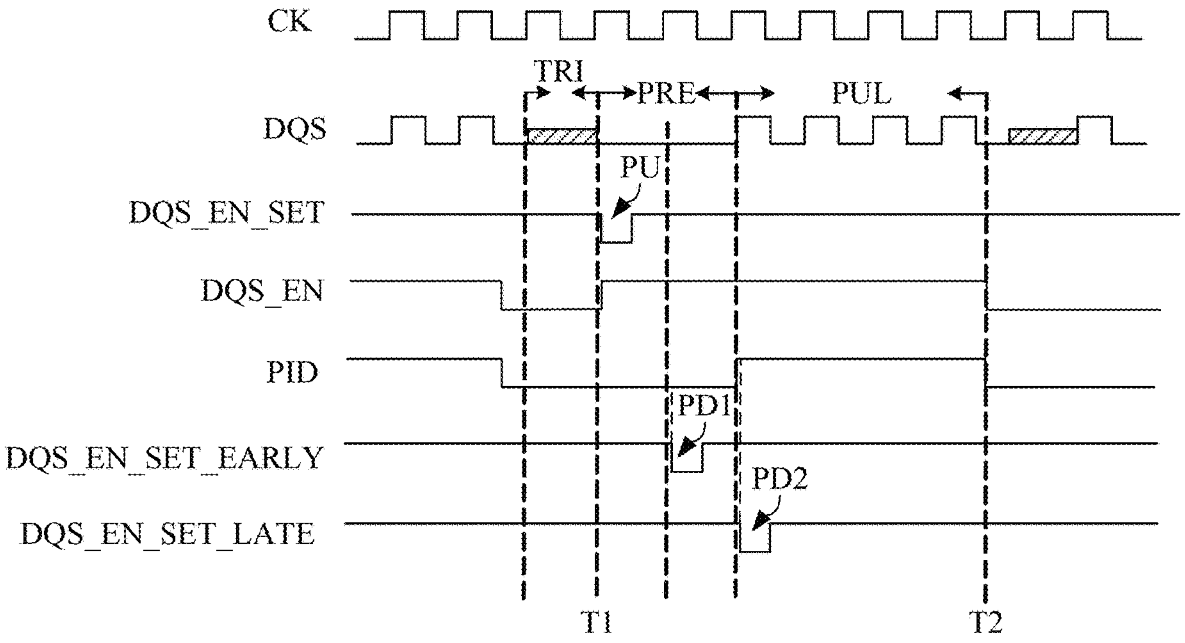
FIG. 2 illustrates a waveform diagram of signals related to the operation of the memory signal calibration apparatus according to an embodiment of the present invention.

Reference is now made to FIG. 1 and FIG. 2 at the same time. FIG. 1 illustrates a block diagram of a memory signal calibration apparatus 100 according to an embodiment of the present invention. FIG. 2 illustrates a waveform diagram of signals related to the operation of the memory signal calibration apparatus 100 according to an embodiment of the present invention.

In an embodiment, the memory signal calibration apparatus 100 is disposed in a memory access interface apparatus. The memory access interface apparatus is an apparatus in a memory system used to access a memory apparatus according to the control of a memory access controller.

More specifically, the memory access controller generates access commands according to the control of such as, but not limited to a processor. When the access commands are used to perform read operation, the memory access interface apparatus processes the access commands to read the memory apparatus and transmit the data provided by the memory apparatus to the memory access controller such that the memory access controller further transmits the data to the processor.

In an embodiment, the memory apparatus is a double data rate (DDR) memory. Besides providing the data, the memory apparatus also provides a data strobe signal DQS to the memory access interface apparatus such that the memory access interface apparatus samples the received data according to the data strobe signal DQS. The memory signal calibration apparatus 100 can perform calibration on the timing of the receiving of the data strobe signal DQS.

The memory signal calibration apparatus 100 includes an enablement signal setting circuit 110, a gating circuit 120 and a calibration circuit 130.

The enablement signal setting circuit 110 is configured to generate a setting control signal SET according to a clock signal CK from the system of the memory signal calibration apparatus 100. In an embodiment, the enablement signal setting circuit 110 includes a coarse-tuning clock edge selector and a fine-tuning delay chain controller (not illustrated in the figure). Such an embodiment can be referred to the applicant's US application having the application number of U.S. Ser. No. 16/177,603. However, the present invention is not limited thereto.

The gating circuit 120 is electrically coupled to the enablement signal setting circuit 110. The gating circuit 120 generates a data strobe enablement setting signal DQS_EN_SET having a single pulse PU according to the setting control signal SET.

As illustrated in FIG. 2, in the present embodiment, the data strobe enablement setting signal DQS_EN_SET keeps staying at a high state before the pulse PU is generated and the pulse PU that is a low state pulse is generated at a time spot T1.

In other embodiments, the data strobe enablement setting signal DQS_EN_SET may generate the pulse that is a high state depending on the requirements.

The gating circuit 120 begins to generate and maintain an enablement state of a data strobe enablement signal DQS_EN for a predetermined time period according to the single pulse PU of the data strobe enablement setting signal DQS_EN_SET. Since the data strobe enablement signal DQS_EN is a signal only used inside of the gating circuit 120, the data strobe enablement signal DQS_EN is not illustrated in FIG. 1. Only the waveform of the data strobe enablement signal DQS_EN is illustrated in FIG. 2.

As illustrated in FIG. 2, the data strobe enablement signal DQS_EN is originally at a non-enablement state, turns from the non-enablement state to the enablement state at the time spot T1 and maintains to be at the enablement state for a predetermined time period so as to return to the non-enablement state from the enablement state at the time spot T2. In the present embodiment, the non-enablement state is a low state and the enablement state is a high state. However, the present invention is not limited thereto.

The gating circuit 120 performs gating on the data strobe signal DQS having a receiving timing according to the enablement state of the data strobe enablement signal DQS_EN to generate a gated data strobe signal DQSG.

In an embodiment, the data strobe signal DQS includes a preamble section PRE and a clock pulse section PUL. In an embodiment, the data strobe signal DQS can be received by the gating circuit 120 through a signal pad (not illustrated in the figure) electrically coupled to a terminal impedance calibration circuit (not illustrated in the figure). The terminal impedance calibration circuit may modify a signal level of a tristate section TRI of the preamble section PRE to be either a high state or a low state. The present invention is not limited thereto.

Ideally, the gating circuit 120 performs gating corresponding to the preamble section PRE and the clock pulse section PUL of the data strobe signal DQS, as illustrated in FIG. 2, to generate the gated data strobe signal DQSG according to the enablement state of the data strobe enablement signal DQS_EN.

However, when the receiving timing of the data strobe signal DQS is too early or too late, the data strobe enablement signal DQS_EN can not accurately perform gating on the data strobe signal DQS such that the data can not be sampled accurately according to the gated data strobe signal DQSG generated subsequently.

Based on the operation of the internal components thereof, the calibration circuit 130 performs calibration on the timing of the data strobe enablement setting signal DQS_EN_SET and the data strobe enablement signal DQS_EN such that the gating can be performed accurately on the data strobe signal DQS. The configuration and operation of the calibration circuit 130 are described in detail in the following paragraphs.

Figure 3:
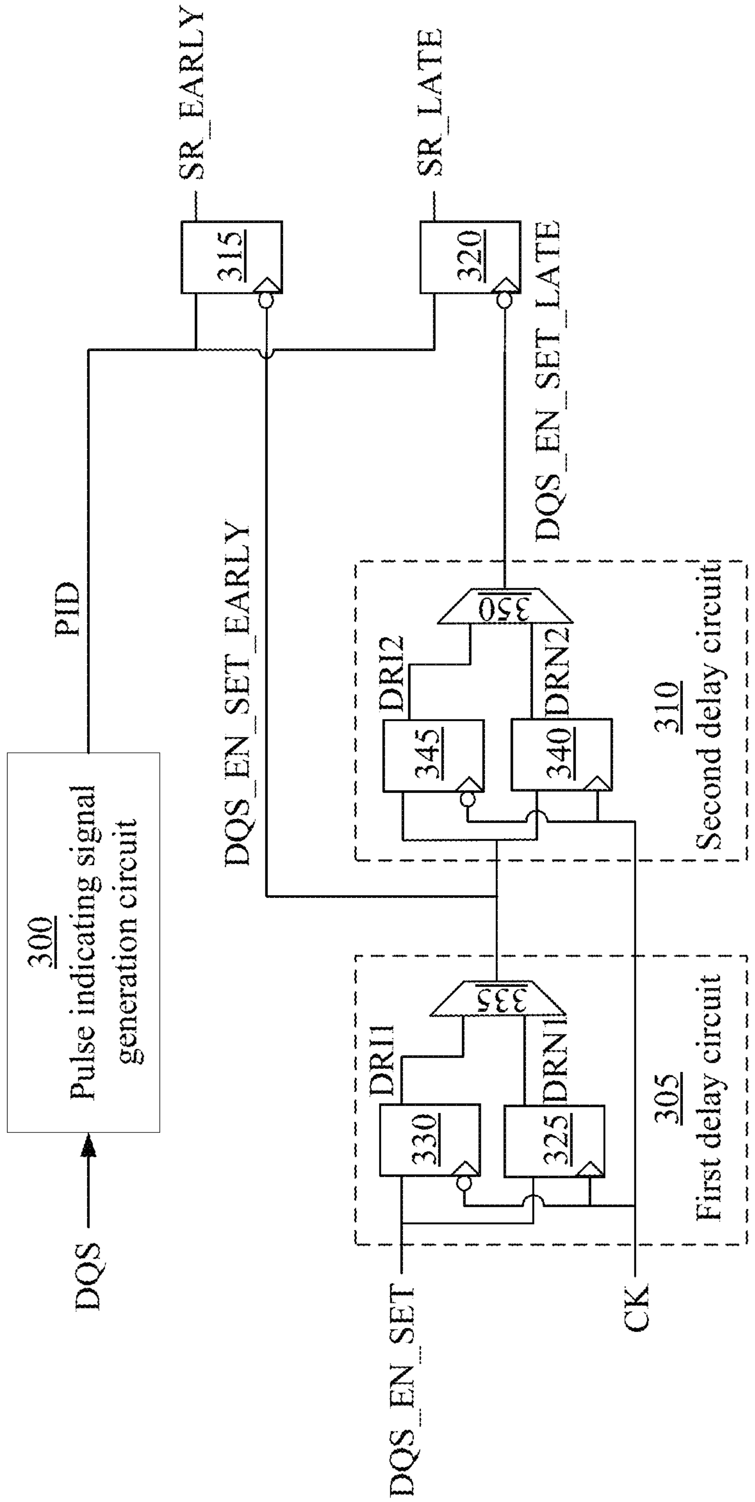
FIG. 3 illustrates a block diagram of the calibration circuit according to an embodiment of the present invention.

Reference is now made to FIG. 3. FIG. 3 illustrates a block diagram of the calibration circuit 130 according to an embodiment of the present invention. The calibration circuit 130 includes a pulse indicating signal generation circuit 300, a first delay circuit 305, a second delay circuit 310, a first sampling flip-flop 315 and a second sampling flip-flop 320.

The pulse indicating signal generation circuit 300 is configured to receive the data strobe signal DQS to generate a pulse indicating signal PID illustrated in FIG. 2, wherein the pulse indicating signal PID has an indicating state corresponding to the clock pulse section PUL of the data strobe signal DQS. In the present embodiment, the indicating state is a high state.

The first delay circuit 305 is configured to delay the data strobe enablement setting signal DQS_EN_SET to generate a first delay signal DQS_EN_SET_EARLY.

In an embodiment, the first delay circuit 305 includes a first non-inverted delay flip-flop 325, a first inverted delay flip-flop 330 and a first multiplexer 335.

The first non-inverted delay flip-flop 325 is configured to receive the data strobe enablement setting signal DQS_EN_SET and the clock signal CK to generate a first non-inverted delay result DRN1 delayed for a cycle relative to the data strobe enablement setting signal DQS_EN_SET.

The first inverted delay flip-flop 330 is configured to receive the data strobe enablement setting signal DQS_EN_SET and the inverted clock signal CK to generate a first inverted delay result DRI1 delayed for a half cycle relative to the data strobe enablement setting signal DQS_EN_SET. In FIG. 3, a sign "○" is added to the terminal of the first inverted delay flip-flop 330 that receives the clock signal CK to indicate the inversion.

The first multiplexer 335 is configured to select one of the first non-inverted delay result DRN1 and the first inverted delay result DRI1 to be the first delay signal DQS_EN_SET_EARLY.

The second delay circuit 310 is configured to delay the first delay signal DQS_EN_SET_EARLY to generate a second delay signal DQS_EN_SET_LATE.

In an embodiment, the second delay circuit 310 includes a second non-inverted delay flip-flop 340, a second inverted delay flip-flop 345 and a second multiplexer 350.

The second non-inverted delay flip-flop 340 is configured to receive the first delay signal DQS_EN_SET_EARLY and the clock signal CK to generate a second non-inverted delay result DRN2 delayed for a cycle relative to the first delay signal DQS_EN_SET_EARLY.

The second inverted delay flip-flop 345 is configured to receive the first delay signal DQS_EN_SET_EARLY and the inverted clock signal CK to generate a second inverted delay result DRI2 delayed for a half cycle relative to the first delay signal DQS_EN_SET_EARLY. Similarly, in FIG. 3, a sign "○" is added to the terminal of the second inverted delay flip-flop 345 that receives the clock signal CK to indicate the inversion.

The second multiplexer 350 is configured to select one of the second non-inverted delay result DRN2 and the second inverted delay result DRI2 to be a second delay signal DQS_EN_SET_LATE.

It is appreciated that the configurations of the first delay circuit 305 and the second delay circuit 310 illustrated in FIG. 3 is merely an example. In other embodiments, the first delay circuit 305 and the second delay circuit 310 may include more number of the inverted delay flip-flops and the non-inverted delay flip-flops to accomplish a delay result with more cycles. The present invention is not limited thereto.

In FIG. 2, a first signal delay amount of the first delay signal DQS_EN_SET_EARLY relative to the data strobe enablement setting signal DQS_EN_SET is a single cycle. A second signal delay amount of the second delay signal DQS_EN_SET_LATE relative to the first delay signal DQS_EN_SET_EARLY is also a single cycle. As a result, the first signal delay amount that the first delay circuit 305 corresponds to is the same as the second signal delay amount that the second delay circuit 310 corresponds to.

However, in practical applications, the first signal delay amount that the first delay circuit 305 corresponds to can be different from the second signal delay amount that the second delay circuit 310 corresponds to. For example, the first signal delay amount that the first delay circuit 305 and the second signal delay amount that the second delay circuit 310 can respectively be set to a half cycle and a single cycle. The present invention is not limited thereto.

The first sampling flip-flop 315 and the second sampling flip-flop 320 sample the pulse indicating signal PID according to the first delay signal DQS_EN_SET_EARLY and the second delay signal DQS_EN_SET_LATE to generate a sampling result SR.

In an embodiment, the first sampling flip-flop 315 is configured to receive the pulse indicating signal PID and the first delay signal DQS_EN_SET_EARLY to perform sampling to generate a first sampled state SR_EARLY included by the sampling result SR.

Since the first delay signal DQS_EN_SET_EARLY includes a first delay pulse PD1 generated by delaying the single pulse PU of the data strobe enablement setting signal DQS_EN_SET, the first sampling flip-flop 315 samples the pulse indicating signal PID according to the first delay pulse PD1. In an embodiment, the first sampling flip-flop 315 may sample the pulse indicating signal PID according to a rising edge that is inverted from a falling edge (in which the falling edge is the part of the signal turning from a high state to a low state) of the first delay pulse PD1.

The second sampling flip-flop 320 is configured to receive the pulse indicating signal PID and the second delay signal DQS_EN_SET_LATE to perform sampling to generate a second sampled state SR_LATE included by the sampling result SR.

Since the second delay signal DQS_EN_SET_EARLY includes a second delay pulse PD2 generated by delaying the first delay pulse PD1 of the first delay signal DQS_EN_SET_EARLY, the second sampling flip-flop 320 samples the pulse indicating signal PID according to the second delay pulse PD2. In an embodiment, the second sampling flip-flop 320 may sample the pulse indicating signal PID according to a rising edge that is inverted from a falling edge (in which the falling edge is the part of the signal turning from a high state to a low state) of the second delay pulse PD2.

The first sampling flip-flop 315 and the second sampling flip-flop 320 respectively transmit the first sampled state SR_EARLY and the second sampled state SR_LATE to the enablement signal setting circuit 110 such that the enablement signal setting circuit 110 adjusts the setting control signal SET according to the sampling result SR so as to control the gating circuit 120 to adjust the timings of the data strobe enablement setting signal DQS_EN_SET and the data strobe enablement signal DQS_EN.

In an embodiment, when the sampling result SR indicates that different sampling states are generated according to the sampling of the first delay signal DQS_EN_SET_EARLY and the second delay signal DQS_EN_SET_LATE, e.g. the condition that the first sampled state SR_EARLY is the low state and the second sampled state SR_LATE is the high state illustrated in FIG. 2, the enablement signal setting circuit 110 determines that the receiving timing of the data strobe signal DQS corresponds to an aligned state and controls the gating circuit 120 to not move the timings of the data strobe enablement setting signal DQS_EN_SET and the data strobe enablement signal DQS_EN by using the setting control signal SET.

In an embodiment, when the sampling result SR indicates that the same sampled state is generated according to the sampling of both of the first delay signal DQS_EN_SET_EARLY and the second delay signal DQS_EN_SET_LATE, the enablement signal setting circuit 110 determines that the receiving timing of the data strobe signal DQS corresponds to either an early state or a late state. Under such a condition, the timings of the data strobe enablement setting signal DQS_EN_SET and the data strobe enablement signal DQS_EN needs to be adjusted.

Figure 4:
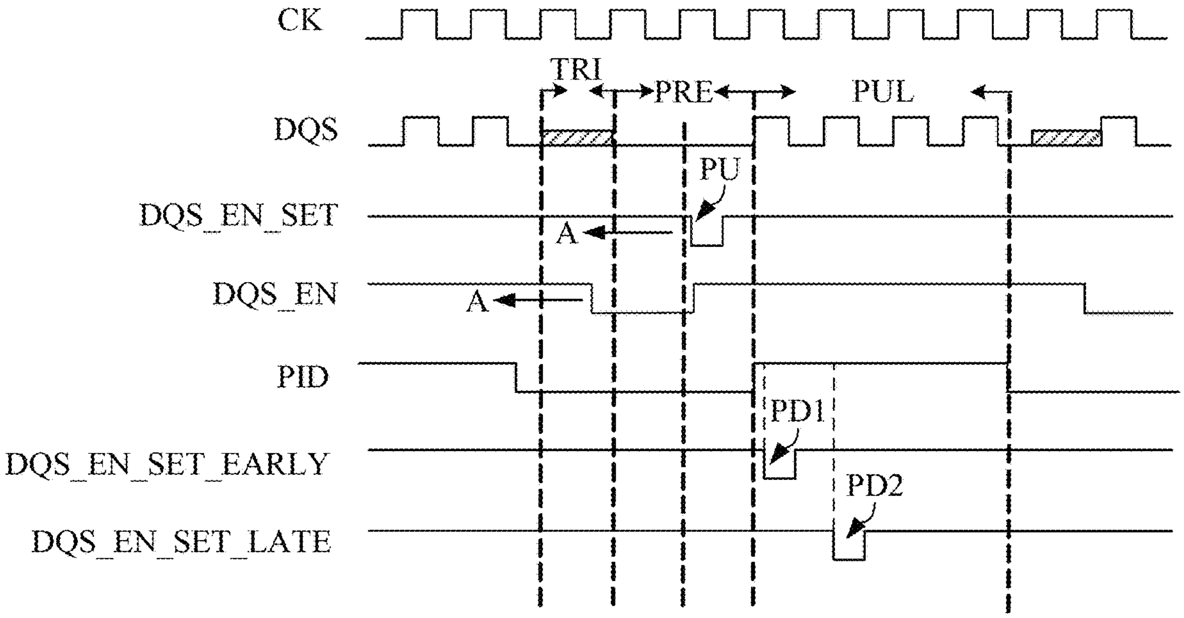
FIG. 4 illustrates a waveform diagram of signals related to the operation of the memory signal calibration apparatus according to another embodiment of the present invention.

Reference is now made to FIG. 4. FIG. 4 illustrates a waveform diagram of signals related to the operation of the memory signal calibration apparatus 100 according to another embodiment of the present invention.

When the sampling result SR indicates that the same sampled state is generated according to the sampling of both of the first delay signal DQS_EN_SET_EARLY and the second delay signal DQS_EN_SET_LATE and sampled state is the same as the indicating state, e.g., the condition that both of the first sampled state SR_EARLY and the second sampled state SR_LATE are high states and such a state is the same as the indicating state, the enablement signal setting circuit 110 determines that the receiving timing of the data strobe signal DQS corresponds to a late state and controls the gating circuit 120 to move the timings of the data strobe enablement setting signal DQS_EN_SET and the data strobe enablement signal DQS_EN forward along the direction A by using the setting control signal SET.

Figure 5:
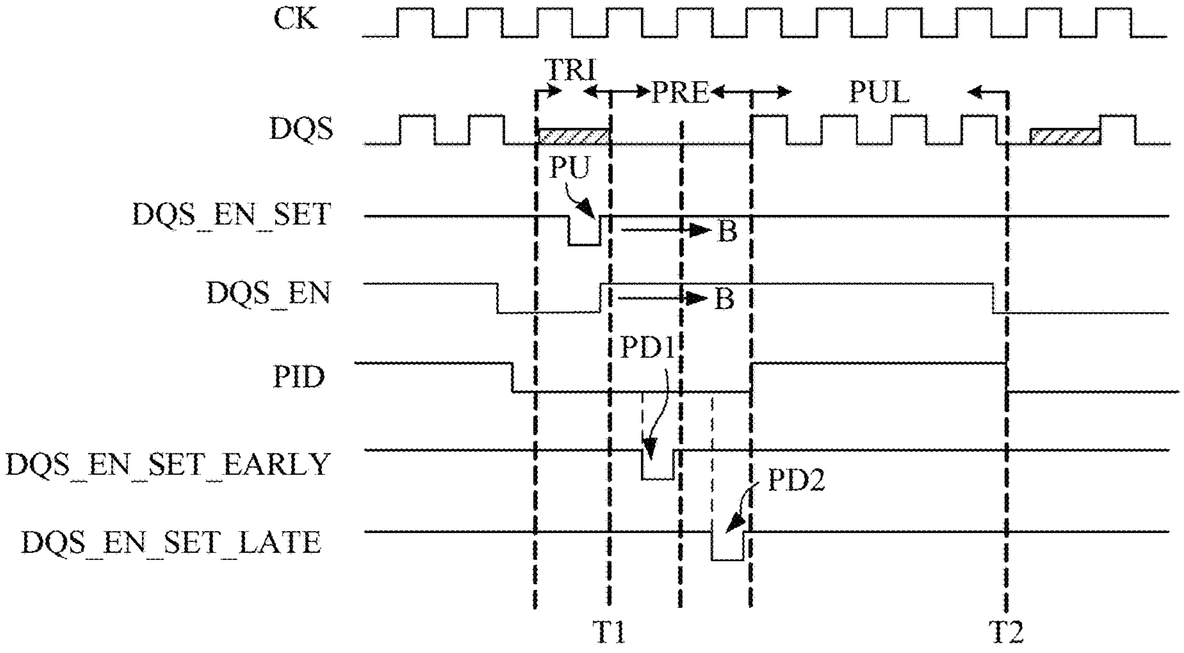
FIG. 5 illustrates a waveform diagram of signals related to the operation of the memory signal calibration apparatus according to yet another embodiment of the present invention.

Reference is now made to FIG. 5. FIG. 5 illustrates a waveform diagram of signals related to the operation of the memory signal calibration apparatus 100 according to yet another embodiment of the present invention.

When the sampling result SR indicates that the same sampled state is generated according to the sampling of both of the first delay signal DQS_EN_SET_EARLY and the second delay signal DQS_EN_SET_LATE and sampled state is not the same as the indicating state, e.g., the condition that both of the first sampled state SR_EARLY and the second sampled state SR_LATE are low states and such a state is not the same as the indicating state, the enablement signal setting circuit 110 determines that the receiving timing of the data strobe signal DQS corresponds to a late state and controls the gating circuit 120 to move the timings of the data strobe enablement setting signal DQS_EN_SET and the data strobe enablement signal DQS_EN backward along the direction B by using the setting control signal SET.

In an embodiment, the timings of the data strobe enablement setting signal DQS_EN_SET and the data strobe enablement signal DQS_EN can be adjusted once or more than once, in which each iteration of the adjustment can be such as, but not limited to one cycle, until different sampled states generated according to the first delay signal DQS_EN_SET_EARLY and the second delay signal DQS_EN_SET_LATE are obtained.

In some approaches, in order to determine the timing of the data strobe signal, the memory signal calibration apparatus includes logic gates, e.g., a combination of NAND gates, to delay the data strobe enablement setting signal and/or the data strobe signal and generate the related signals for determination accordingly. Such a method facing the challenge of the variation of the delay time due to the variation of the temperature, voltage and manufacturing process that easily affects the logic gates such that the determination of the timings becomes inaccurate. Further, the determination directly performed based on the data strobe signal may not provide enough room for an accurate determination due to the higher frequency of the data strobe signal.

The memory signal calibration apparatus of the present invention delays a data strobe enablement setting signal without using logic gates to generate a delayed signal used for sampling to avoid the influence of the temperature, voltage and manufacturing process. Further, by selecting the pulse indicating signal corresponding to the clock pulse section as the object being sampled instead of the data strobe signal itself can provide much room for sampling to generate the sampling result since the frequency of the pulse indicating signal is much lower than the frequency of the data strobe signal. Not only the accuracy of the determination of the timing of the data strobe signal can be increased, but also the accuracy of the adjustment of the timing of the data strobe enablement signal can be increased.

Figure 6:
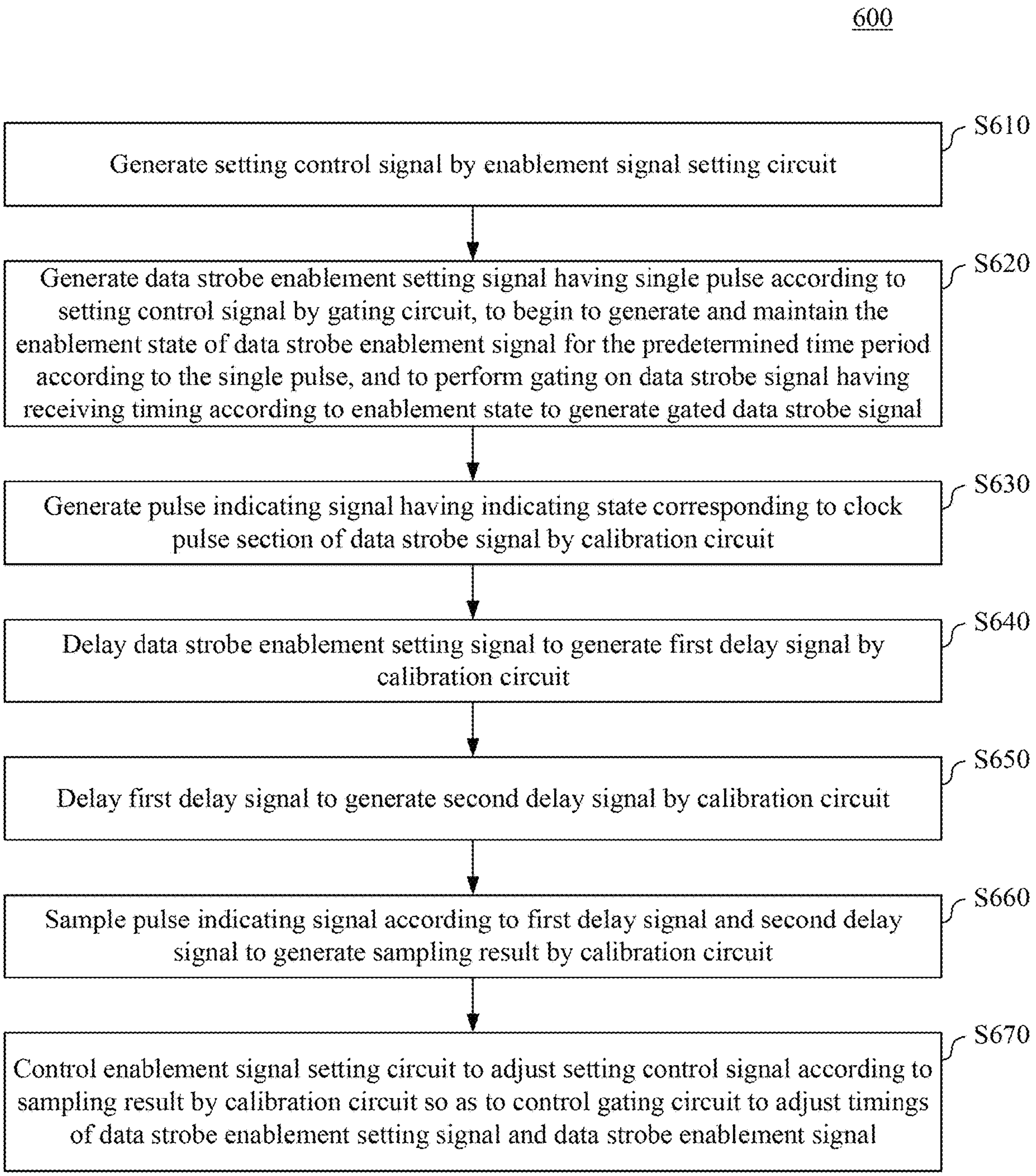
FIG. 6 illustrates a flow chart of a memory signal calibration method according to an embodiment of the present invention.

Reference is now made to FIG. 6. FIG. 6 illustrates a flow chart of a memory signal calibration method 600 according to an embodiment of the present invention.

Besides the apparatus described above, the present invention further discloses the memory signal calibration method 600 that can be used in such as, but not limited to the memory signal calibration apparatus 100 illustrated in FIG. 1. An embodiment of the memory signal calibration method 600 is illustrated in FIG. 6 and includes the steps outlined below.

In step S610, the setting control signal SET is generated by the enablement signal setting circuit 110.

In step S620, the data strobe enablement setting signal DQS_EN_SET having the single pulse PU is generated according to the setting control signal SET by the gating circuit 120, to begin to generate and maintain the enablement state of the data strobe enablement signal DQS_EN for the predetermined time period according to the single pulse PU, and to perform gating on the data strobe signal DQS having the receiving timing according to the enablement state to generate the gated data strobe signal DQSG.

In step S630, the pulse indicating signal PID having the indicating state corresponding to the clock pulse section PUL of the data strobe signal DQS is generated by the calibration circuit 130.

In step S640, the data strobe enablement setting signal is delayed to generate the first delay signal DQS_EN_SET_EARLY by the calibration circuit 130.

In step S650, the first delay signal DQS_EN_SET_EARLY is delayed to generate the second delay signal DQS_EN_SET_LATE by the calibration circuit 130.

In step S660, the pulse indicating signal PID is sampled according to the first delay signal DQS_EN_SET_EARLY and the second delay signal DQS_EN_SET_LATE to generate the sampling result SR by the calibration circuit 130.

In step S670, the enablement signal setting circuit 110 is controlled to adjust the setting control signal SET according to the sampling result SR by the calibration circuit 130 so as to control the gating circuit 120 to adjust the timings of the data strobe enablement setting signal DQS_EN_SET and the data strobe enablement signal DQS_EN.

It is appreciated that the embodiments described above are merely an example. In other embodiments, it is appreciated that many modifications and changes may be made by those of ordinary skill in the art without departing, from the spirit of the invention.

In summary, the memory signal calibration apparatus and the memory signal calibration method of the present invention delay a data strobe enablement setting signal without using logic gates to generate a delayed signal used for sampling to avoid the influence of the temperature, voltage and manufacturing process. Further, by selecting the pulse indicating signal corresponding to the clock pulse section as the object being sampled instead of the data strobe signal itself can provide much room for sampling to generate the sampling result since the frequency of the pulse indicating signal is much lower than the frequency of the data strobe signal. Not only the accuracy of the determination of the timing of the data strobe signal can be increased, but also the accuracy of the adjustment of the timing of the data strobe enablement signal can be increased.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A memory signal calibration apparatus, comprising:

an enablement signal setting circuit configured to generate a setting control signal;

a gating circuit configured to generate a data strobe enablement setting signal having a single pulse according to the setting control signal, to begin to generate and maintain an enablement state of a data strobe enablement signal for a predetermined time period according to the single pulse, and to perform gating on a data strobe signal having a receiving timing according to the enablement state to generate a gated data strobe signal; and a calibration circuit configured to:

generate a pulse indicating signal having an indicating state corresponding to a clock pulse section of the data strobe signal, wherein the clock pulse section is behind a tristate section and a preamble section of the data strobe signal and comprises clock pulses;

delay the data strobe enablement setting signal to generate a first delay signal;

delay the first delay signal to generate a second delay signal;

sample the pulse indicating signal according to the first delay signal and the second delay signal to generate a sampling result; and control the enablement signal setting circuit to adjust the setting control signal according to the sampling result so as to control the gating circuit to adjust timings of the data strobe enablement setting signal and the data strobe enablement signal.

2. The memory signal calibration apparatus of claim 1, wherein the sampling result indicates that a same sampled state is generated according to the sampling of both of the first delay signal and the second delay signal and the sampled state is the same as the indicating state such that the enablement signal setting circuit determines that the receiving timing of the data strobe signal corresponds to a late state and controls the gating circuit to move the timings of the data strobe enablement setting signal and the data strobe enablement signal forward by using the setting control signal;

the sampling result indicates that the same sampled state is generated according to the sampling of both of the first delay signal and the second delay signal and the sampled state is not the same as the indicating state such that the enablement signal setting circuit determines that the receiving timing of the data strobe signal corresponds to an early state and controls the gating circuit to move the timings of the data strobe enablement setting signal and the data strobe enablement signal backward by using the setting control signal; and the sampling result indicates that different sampling states are generated according to the sampling of the first delay signal and the second delay signal such that the enablement signal setting circuit determines that the receiving timing of the data strobe signal corresponds to an aligned state and controls the gating circuit to not move the timings of the data strobe enablement setting signal and the data strobe enablement signal by using the setting control signal.

3. The memory signal calibration apparatus of claim 1, wherein the calibration circuit comprises:

a pulse indicating signal generation circuit configured to receive the data strobe signal to generate the pulse indicating signal;

a first sampling flip-flop configured to receive the pulse indicating signal and the first delay signal to perform sampling to generate a first sampled state comprised by the sampling result; and a second sampling flip-flop configured to receive the pulse indicating signal and the second delay signal to perform sampling to generate a second sampled state comprised by the sampling result.

4. The memory signal calibration apparatus of claim 1, wherein the calibration circuit comprises:

a first delay circuit comprising:

a first non-inverted delay flip-flop configured to receive the data strobe enablement setting signal and a clock signal to generate a first non-inverted delay result delayed for a cycle relative to the data strobe enablement setting signal;

a first inverted delay flip-flop configured to receive the data strobe enablement setting signal and an inverted clock signal to generate a first inverted delay result delayed for a half cycle relative to the data strobe enablement setting signal delay, wherein the inverted clock signal is an inversion of the clock signal; and a first multiplexer configured to select one of the first non-inverted delay result and the first inverted delay result to be the first delay signal; and a second delay circuit comprising:

a second non-inverted delay flip-flop configured to receive the first delay signal and the clock signal to generate a second non-inverted delay result delayed for a cycle relative to the first delay signal delay;

a second inverted delay flip-flop configured to receive the first delay signal and the inverted clock signal to generate a second inverted delay result delayed for a half cycle relative to the first delay signal delay; and a second multiplexer configured to select one of the second non-inverted delay result and the second inverted delay result to be the second delay signal.

5. The memory signal calibration apparatus of claim 4, wherein a first signal delay amount corresponding to the first delay circuit and a second signal delay amount corresponding to the second delay circuit are either the same or different.

6. The memory signal calibration apparatus of claim 1, wherein the first delay signal and the second delay signal respectively have a first delay pulse and a second delay pulse, and the first delay signal and the second delay signal respectively sample the pulse indicating signal according to the first delay pulse and the second delay pulse.

7. The memory signal calibration apparatus of claim 1, wherein the memory signal calibration apparatus is disposed in a memory access interface apparatus in a memory system that accesses a memory apparatus according to the control of a memory access controller.

8. The memory signal calibration apparatus of claim 1, wherein the gating circuit adjusts the timing of the data strobe enablement signal to perform gating corresponding to the preamble section and the clock pulse section of the data strobe signal to generate the gated data strobe signal.

9. A memory signal calibration method used in a memory signal calibration apparatus, comprising:

generating a setting control signal by an enablement signal setting circuit;

generating a data strobe enablement setting signal having a single pulse according to the setting control signal by a gating circuit, to begin to generate and maintain an enablement state of a data strobe enablement signal for a predetermined time period according to the single pulse, and to perform gating on a data strobe signal having a receiving timing according to the enablement state to generate a gated data strobe signal;

generating a pulse indicating signal having an indicating state corresponding to a clock pulse section of the data strobe signal by a calibration circuit, wherein the clock pulse section is behind a tristate section and a preamble section of the data strobe signal and comprises clock pulses;

delaying the data strobe enablement setting signal to generate a first delay signal by the calibration circuit;

delaying the first delay signal to generate a second delay signal by the calibration circuit;

sampling the pulse indicating signal according to the first delay signal and the second delay signal to generate a sampling result by the calibration circuit; and controlling the enablement signal setting circuit to adjust the setting control signal according to the sampling result by the calibration circuit so as to control the gating circuit to adjust timings of the data strobe enablement setting signal and the data strobe enablement signal.

10. The memory signal calibration method of claim 9, wherein the sampling result indicates that a same sampled state is generated according to the sampling of both of the first delay signal and the second delay signal and the sampled state is the same as the indicating state such that the enablement signal setting circuit determines that the receiving timing of the data strobe signal corresponds to a late state and controls the gating circuit to move the timings of the data strobe enablement setting signal and the data strobe enablement signal forward by using the setting control signal;

the sampling result indicates that the same sampled state is generated according to the sampling of both of the first delay signal and the second delay signal and the sampled state is not the same as the indicating state such that the enablement signal setting circuit determines that the receiving timing of the data strobe signal corresponds to an early state and controls the gating circuit to move the timings of the data strobe enablement setting signal and the data strobe enablement signal backward by using the setting control signal; and the sampling result indicates that different sampling states are generated according to the sampling of the first delay signal and the second delay signal such that the enablement signal setting circuit determines that the receiving timing of the data strobe signal corresponds to an aligned state and controls the gating circuit to not move the timings of the data strobe enablement setting signal and the data strobe enablement signal by using the setting control signal.

11. The memory signal calibration method of claim 9, further comprising:

receiving the data strobe signal by a pulse indicating signal generation circuit of the calibration circuit to generate the pulse indicating signal;

receiving the pulse indicating signal and the first delay signal to perform sampling by a first sampling flip-flop of the calibration circuit to generate a first sampled state comprised by the sampling result; and receiving the pulse indicating signal and the second delay signal to perform sampling by a second sampling flip-flop of the calibration circuit to generate a second sampled state comprised by the sampling result.

12. The memory signal calibration method of claim 9, further comprising:

receiving the data strobe enablement setting signal and a clock signal by a first non-inverted delay flip-flop of a first delay circuit of the calibration circuit to generate a first non-inverted delay result delayed for a cycle relative to the data strobe enablement setting signal;

receiving the data strobe enablement setting signal and an inverted clock signal by a first inverted delay flip-flop of the first delay circuit of the calibration circuit to generate a first inverted delay result delayed for a half cycle relative to the data strobe enablement setting signal delay, wherein the inverted clock signal is an inversion of the clock signal;

selecting one of the first non-inverted delay result and the first inverted delay result to be the first delay signal by a first multiplexer of the first delay circuit of the calibration circuit;

receiving the first delay signal and the clock signal by a second non-inverted delay flip-flop of a second delay circuit of the calibration circuit to generate a second non-inverted delay result delayed for a cycle relative to the first delay signal delay;

receiving the first delay signal and the inverted clock signal by a second inverted delay flip-flop of the second delay circuit of the calibration circuit to generate a second inverted delay result delayed for a half cycle relative to the first delay signal delay; and selecting one of the second non-inverted delay result and the second inverted delay result to be the second delay signal by a second multiplexer of the second delay circuit of the calibration circuit.

13. The memory signal calibration method of claim 12, wherein a first signal delay amount corresponding to the first delay circuit and a second signal delay amount corresponding to the second delay circuit are either the same or different.

14. The memory signal calibration method of claim 9, wherein the first delay signal and the second delay signal respectively have a first delay pulse and a second delay pulse, and the first delay signal and the second delay signal respectively sample the pulse indicating signal according to the first delay pulse and the second delay pulse.

15. The memory signal calibration method of claim 9, wherein the memory signal calibration apparatus is disposed in a memory access interface apparatus in a memory system that accesses a memory apparatus according to the control of a memory access controller.

16. The memory signal calibration method of claim 9, further comprising:

adjusting the timing of the data strobe enablement signal by the gating circuit to perform gating corresponding to the preamble section and the clock pulse section of the data strobe signal to generate the gated data strobe signal.

* * * * *